(12) United States Patent
Zhu

(10) Patent No.: US 9,287,281 B2
(45) Date of Patent: Mar. 15, 2016

(54) FLASH DEVICES AND METHODS OF MANUFACTURING THE SAME

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

(*) Notice: Subject to any disclaimer, the term of this patent is extended or adjusted under 35 U.S.C. 154(b) by 0 days.

(21) Appl. No.: 14/403,042

(22) PCT Filed: Apr. 26, 2013

(86) PCT No.: PCT/CN2013/074771
§ 371 (c)(1),
(2) Date: Nov. 21, 2014

(87) PCT Pub. No.: WO2014/153798
PCT Pub. Date: Oct. 2, 2014

(65) Prior Publication Data
US 2015/0171096 A1 Jun. 18, 2015

(30) Foreign Application Priority Data
Mar. 26, 2013 (CN) .......................... 2013 1 0100318

(51) Int. Cl.
*H01L 27/115* (2006.01)
*H01L 21/28* (2006.01)
(Continued)

(52) U.S. Cl.
CPC ...... *H01L 27/11521* (2013.01); *H01L 21/0257* (2013.01); *H01L 21/0334* (2013.01);
(Continued)

(58) Field of Classification Search
CPC ................... H01L 27/11521; H01L 21/28273; H01L 29/788; H01L 29/66795; H01L 29/785; H01L 21/0257; H01L 21/0334; H01L 21/266; H01L 29/1083; H01L 29/4916; H01L 29/4966; H01L 29/66825; H01L 29/7843; H01L 29/7848
See application file for complete search history.

(56) References Cited

FOREIGN PATENT DOCUMENTS

| CN | 102034831 A | 4/2011 |
| CN | 102194756 A | 9/2011 |

(Continued)

OTHER PUBLICATIONS

International Search Report issued in International Patent Application No. PCT/CN2013/074771, dated Jan. 2, 2014.
(Continued)

*Primary Examiner* — Long Pham
(74) *Attorney, Agent, or Firm* — Pillsbury Winthrop Shaw Pittman LLP

(57) ABSTRACT

Flash devices and methods of manufacturing the same are provided. The device may include: a semiconductor substrate, with a well region therein; a sandwich arrangement on the well region, including a back gate conductor, semiconductor fins on opposite sides of the back gate conductor, and back gate dielectric layers separating the back gate conductor from the respective semiconductor fins, wherein the well region serves as a part of a conductive path to the back gate conductor; a front gate stack intersecting the semiconductor fins, including a floating gate dielectric layer, a floating gate conductor, a control gate dielectric layer, and a control gate conductor stacked sequentially, wherein the floating gate dielectric layer separates the floating gate conductor from the semiconductor fins; an insulating cap on top of the back gate conductor and the semiconductor fins to separate the back gate conductor from the front gate stack; and source and drain regions connected to a channel region provided by each of the semiconductor fins. The device can achieve high integration and low power consumption.

21 Claims, 18 Drawing Sheets

(51) Int. Cl.
*H01L 29/788* (2006.01)
*H01L 29/66* (2006.01)
*H01L 29/78* (2006.01)
*H01L 21/02* (2006.01)
*H01L 21/033* (2006.01)
*H01L 21/266* (2006.01)
*H01L 29/10* (2006.01)
*H01L 29/49* (2006.01)

(52) U.S. Cl.
CPC ........ *H01L21/266* (2013.01); *H01L 21/28273* (2013.01); *H01L 29/1083* (2013.01); *H01L 29/4916* (2013.01); *H01L 29/4966* (2013.01); *H01L 29/66795* (2013.01); *H01L 29/66825* (2013.01); *H01L 29/785* (2013.01); *H01L 29/788* (2013.01); *H01L 29/7843* (2013.01); *H01L 29/7848* (2013.01); *H01L 29/7881* (2013.01)

(56) References Cited

FOREIGN PATENT DOCUMENTS

| | | |
|---|---|---|
| CN | 102832133 A | 12/2012 |
| CN | 102891179 A | 1/2013 |
| WO | 2009/003895 A1 | 1/2009 |

OTHER PUBLICATIONS

Written Opinion of the International Searching Authority, issued in International Patent Application No. PCT/CN2013/074771, dated Jan. 2, 2014.

US 9,287,281 B2

FLASH DEVICES AND METHODS OF MANUFACTURING THE SAME

CROSS-REFERENCE TO RELATED APPLICATION(S)

This application is a National Phase application of PCT Application No. PCT/CN2013/074771 filed on Apr. 26, 2013, entitled "FLASH DEVICES AND METHODS OF MANUFACTURING THE SAME," which claimed priority to Chinese Application No. 201310100318.2, filed on Mar. 26, 2013. Both the PCT application and the Chinese application are incorporated herein by reference in their entireties.

TECHNICAL FIELD

The present disclosure relates to the semiconductor field, and particularly, to flash devices including fins, and methods of manufacturing the same.

BACKGROUND

As the semiconductor technology develops, it is desirable to scale down semiconductor devices to improve integration while reducing power consumption thereof. To reduce the power consumption due to current leakage, UTBB (ultra-thin buried oxide body) devices formed in semiconductor substrates are proposed. The UTBB device comprises an ultra-thin buried oxide layer disposed in the semiconductor substrate, a front gate stack and source/drain regions above the ultra-thin buried oxide layer, and a back gate beneath the ultra-thin buried oxide layer. In operation, a bias may be applied to the back gate to significantly reduce the power consumption while maintaining an operation speed unchanged. At present, it is difficult to apply the UTBB technology to fin-type Flash devices.

SUMMARY

The present disclosure provides, among others, flash devices, including fins and a back gate to improve performances, and methods of accessing the same.

According to an aspect of the present disclosure, there is provided a flash device, comprising: a semiconductor substrate; a well region formed in the semiconductor substrate; a sandwich arrangement on the well region, including a back gate conductor, semiconductor fins on opposite sides of the back gate conductor, and gate dielectric layers separating the back gate conductor from the respective semiconductor fins, wherein the well region serves as a part of a conductive path to the back gate conductor; a front gate stack intersecting the semiconductor fins, including a floating gate dielectric layer, a floating gate conductor, a control gate dielectric layer, and a control gate conductor stacked sequentially, wherein the floating gate dielectric layer separates the floating gate conductor from the semiconductor fins; an insulating cap on top of the back gate conductor and the semiconductor fins to separate the back gate conductor from the control gate conductor; and source and drain regions connected to a channel region provided by each of the semiconductor fins.

According to a further aspect of the present disclosure, there is provided a method of manufacturing a flash device, comprising: forming a well region in a semiconductor substrate, so that a portion of the semiconductor substrate above the well region constitutes a semiconductor layer; forming a sandwich arrangement on the well region, the sandwich arrangement including a back gate conductor, semiconductor fins on opposite sides of the back gate conductor, and gate dielectric layers separating the back gate conductor from the respective semiconductor fins, wherein the well region serves as a part of a conductive path to the back gate conductor; forming a front gate stack intersecting the semiconductor fins, the front gate stack including a floating gate dielectric layer, a floating gate conductor, a control gate dielectric layer, and a control gate conductor stacked sequentially from bottom up, wherein the floating gate dielectric layer separates the floating gate conductor from the semiconductor fins; and forming source and drain regions connected to a channel region provided by each of the semiconductor fins.

According to embodiments of the present disclosure, the flash device comprises the back gate conductor adjacent to a side surface of each of the semiconductor fins. Because the back gate conductor is not present under the semiconductor fins, it is possible to separately define a contact area between the back gate conductor and the well region, which is a part of the conductive path, as desired, to avoid self-heating of the back gate conductor. Further, there is no need to perform ion implantation through the semiconductor fins in forming the back gate conductor, and thus it is possible to avoid unintentional doping of the channel region, which would otherwise cause fluctuations of the performances of the flash device.

This device incorporates advantages of fin-type flash devices and UTBB devices. On one hand, a threshold voltage of the flash device can be controlled or dynamically adjusted by the back gate conductor, to significantly reduce power consumption while maintaining an operation speed unchanged. On the other hand, it is possible to suppress short channel effects by the fins, and thus to maintain the performances of the flash device when scaling down. Therefore, it is possible to scale down the flash device so as to improve integration, while reducing the power consumption. Further, the manufacture of the flash device is compatible with the existing semiconductor processes, resulting in low cost.

BRIEF DESCRIPTION OF THE DRAWINGS

The above and other objects, features, and advantages of the present disclosure will become apparent from following descriptions of embodiments with reference to the attached drawings, in which.

DETAILED DESCRIPTION

Figure 1:
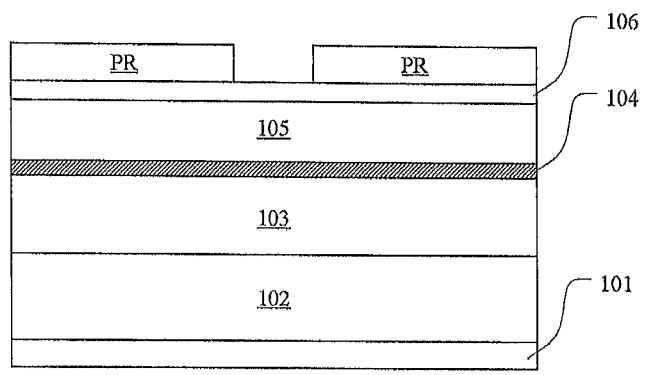
FIGS. 1-15 are schematic views showing a flow of manufacturing a flash device according to an embodiment of the present disclosure.

Hereinafter, descriptions are given with reference to embodiments shown in the attached drawings. In the drawings, like reference symbols denote like elements. For clarity, the drawings are not drawn to scale.

For brief, a semiconductor arrangement having undergone several operations may be presented in one figure.

In the context of the present disclosure, when a layer/area is recited as being "on" or "above" a further layer/area, the layer/area can be disposed directly on or above the further layer/area, or otherwise there may be an intervening layer/ area interposed therebetween. Further, if the orientation is turned, then the layer/area is now "under" or "beneath"the further layer/area.

If a layer/area is recited as being "directly on" or "on and contiguous to" a further layer/area, then there is no such an intervening layer/area.

In the context of the present disclosure, the term "semiconductor arrangement"refers to an arrangement formed in various steps during manufacture, including all already formed layers or areas. Various specifics are described in the following, including specific structures, materials, sizes, and processes, for better understanding of the present disclosure. It is to be understood by those skilled in the art that the technology disclosed herein can be implemented without at least some of those specifics.

Parts of a flash device may comprise materials well known in the art, unless indicated otherwise. For example, a semiconductor material may comprise a III-V group material, such as GaAs, InP, GaN, or SiC, or a V group material, such as Si or Ge. A gate conductor may comprise a conductive material, for example, metal, doped poly silicon, a stack of metal and doped poly silicon, or other conductive materials, such as TaC, TiN, TaTbN, TaErN, TaYbN, TaSiN, HfSiN, MoSiN, RuTax, NiTax, MoNx, TiSiN, TiCN, TaAlC, TiAlN, TaN, PtSix, $Ni_3Si$, Pt, Ru, Ir, Mo, W, HfRu, RuOx, or any combination thereof. Gate dielectrics may comprise $SiO_2$ or a material with a dielectric constant greater than that of $SiO_2$, for example, oxide, such as $SiO_2$, $HfO_2$, $ZrO_2$, $Al_2O_3$, $TiO_2$, or $La_2O_3$, nitride, such as $Si_3N_4$, oxynitride, such as SiON, silicate, such as HfSiOx, aluminate, such as $LaAlO_3$, or titanate, such as $SiTiO_3$. Further, the gate dielectrics may comprise materials to be developed in the future.

The technology disclosed herein may be presented in various ways, some of which will be described in the following by way of example.

Figure 14:
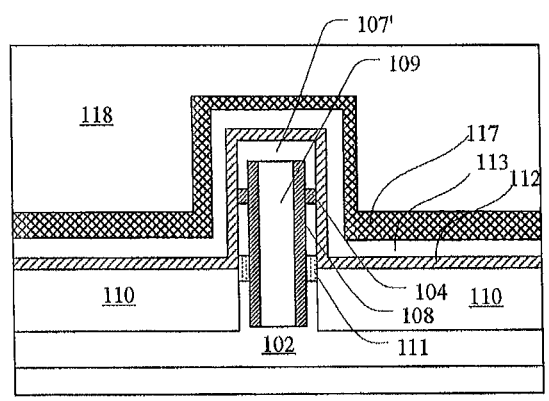
Figure 15A:
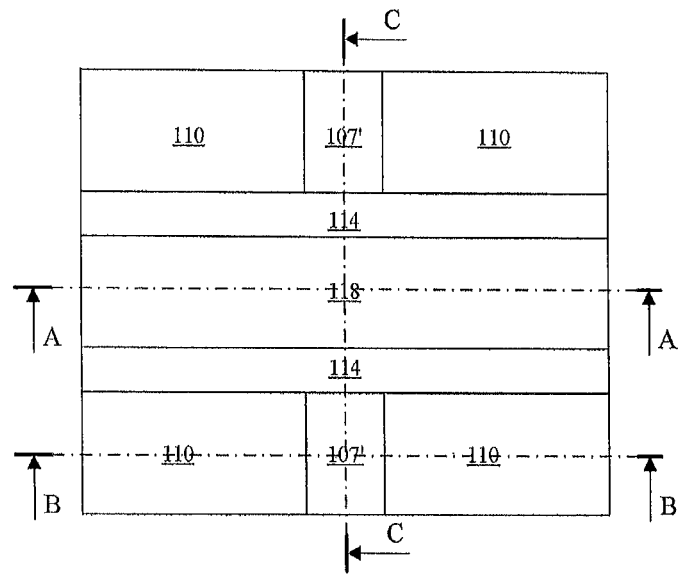
Figure 15B:
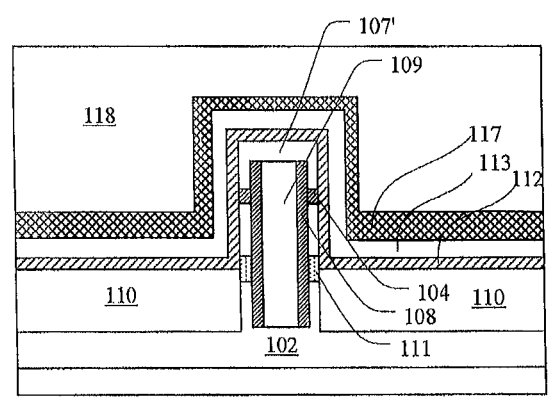
Figure 15C:
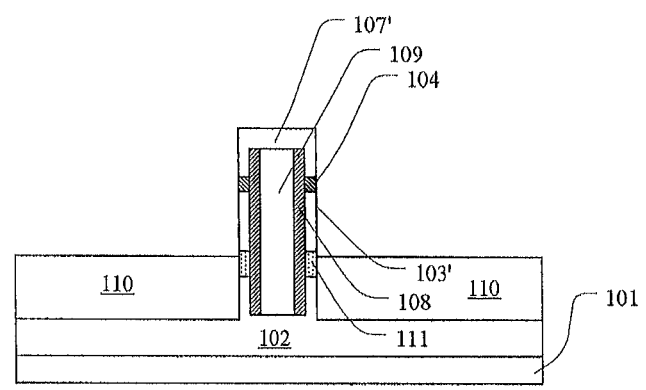
Figure 15D:
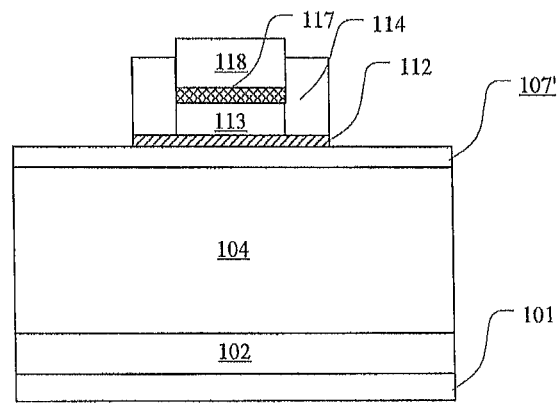

FIGS. 1-15 are schematic views showing a flow of manufacturing a flash device according to an embodiment of the present disclosure, wherein FIG. 15(a) is a top view showing the flash device and shows positions where sectional views are taken, FIGS. 1-14 and 15(b) are sectional views showing the flash device along line A-A in a width direction of a semiconductor fin, FIG. 15(c) is a sectional view showing the flash device along line B-B in the width direction of the semiconductor fin, and FIG. 15(d) is a sectional view showing the flash device along line C-C in a length direction of the semiconductor fin.

The flow starts from a bulk semiconductor substrate 101. A well region 102 may be formed in the bulk semiconductor substrate 101, so that a portion of the semiconductor substrate 101 above the well region 102 constitutes a semiconductor layer 103 which is separated from the semiconductor substrate 101 by the well region 102. The well region 102 may be formed in the semiconductor substrate 101 by well-known processes, for example, by forming a doped region in the semiconductor substrate by ion implantation and then performing annealing to activate dopants in the doped region. The well region 102 may be formed to have n-type conductivity for a p-type flash, or p-type conductivity for an n-type flash. Further, a first mask layer 104, a second mask layer 105, and a third mask layer 106 may be formed in sequence on the semiconductor layer 103 by, for example, existing deposition processes, such as, electron beam evaporation (EBM), chemical vapor deposition (CVD), atomic layer deposition (ALD), sputtering, or the like. Then, a photoresist layer PR may be formed on the third mask layer 106 by, for example, spin-coating, and a pattern for defining a back gate (e.g., an opening with a width of about 15 nm-100 nm) may be formed in the photoresist layer PR by photolithography, including exposing and developing, as shown in FIG. 1.

The semiconductor substrate 101 may comprise any one selected from Si, Ge, SiGe, GaAs, GaSb, AlAs, InAs, InP, GaN, SiC, InGaAs, InSb, and InGaSb. In an example, the semiconductor substrate 101 may comprise single crystal silicon. As described in the following, the semiconductor layer 103 can be used to form semiconductor fins and thus substantially define a height of each of the fins. Parameters adopted in the ion implantation and annealing processes may be adjusted as needed to control depth and extension of the well region 102. Thus, it is possible to achieve the semiconductor layer 103 with a desired thickness.

The first mask layer 104, the second mask layer 105, and the third mask layer 106 may comprise materials of desired chemical and physical properties, to provide desired etching selectivity in etching processes, and/or to server as a stop layer in chemical mechanical polishing (CMP), and/or to further serve as an insulating layer in the flash device when completed. Further, the first mask layer 104, the second mask layer 105, and the third mask layer 106 may be formed by the same deposition process or different deposition processes, for example, those as described above, based on their materials. In an example, the first mask layer 104 may comprise silicon oxide with a thickness of about 5-15 nm formed by thermal oxidation, the second mask layer 105 may comprise amorphous silicon with a thickness of about 50 nm-200 nm formed by sputtering, and the third mask layer 1006 may comprise silicon nitride with a thickness of about 5-15 nm formed by sputtering.

Figure 2:
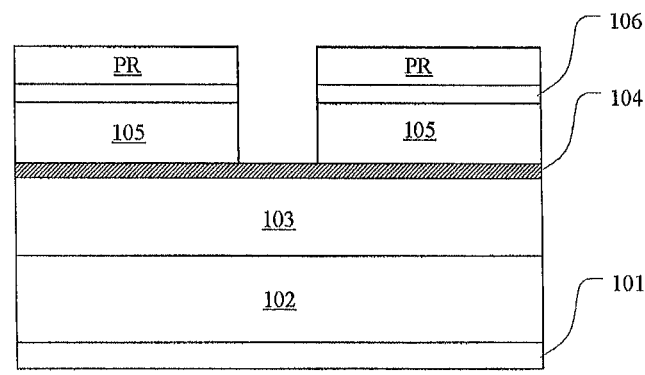

Then, exposes portions of the third mask layer 106 and the second mask layer 105 may be removed sequentially from top down by dry etching, such as, ion milling, plasma etching, reactive ion etching (RIE), laser ablation, or by wet etching with etchant solution, with the photoresist layer PR as a mask, to form an opening therein, as shown in FIG. 2. The etching can stop on top of the first mask layer, due to the etching selectivity or by controlling the duration of the etching. The various layers may be etched in different etching operations. In an example, a first etching operation may be conducted to remove the exposed portion of the third mask layer 106 of, e.g., silicon nitride, with respect to the underlying second mask layer 105 of, e.g., amorphous silicon, by RIE with a suitable etchant, and a second etching operation may be conducted to remove the exposed portion of the second mask layer 105 of, e.g., amorphous silicon, with respect to the underlying first mask layer 104 of, e.g., silicon oxide, by RIE with another suitable etchant.

Figure 3:
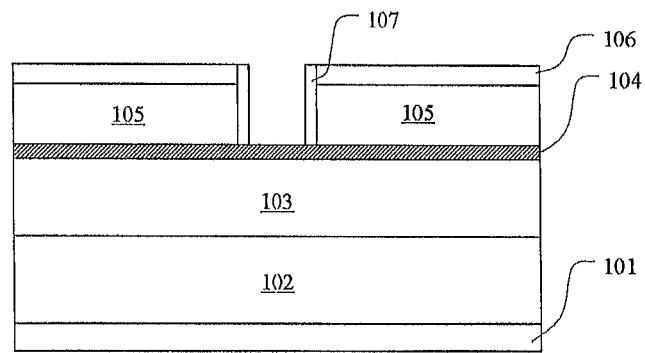

Next, the photoresist layer PR may be removed by being dissolved in a solvent or ashed. A fourth mask layer 107 may be conformally formed on a surface of the semiconductor arrangement by a deposition process as described above. Portions of the fourth mask layer 107 laterally extending on the third mask layer 106 and on bottom of the opening (that is, on a surface of the first mask layer 104) may be removed by anisotropic etching (e.g., RIE), to leave portions of the fourth mask layer 107 on inner walls of the opening, resulting in spacers, as shown in FIG. 3. As described in the following, the fourth mask layer 107 may be used to define a width of the respective semiconductor fins. The fourth mask layer 107 may have a thickness determined based on the desired width of the respective semiconductor fins. In an example, the fourth mask layer 107 may comprise silicon nitride with a thickness of about 3 nm-28 nm formed by ALD.

Figure 4:
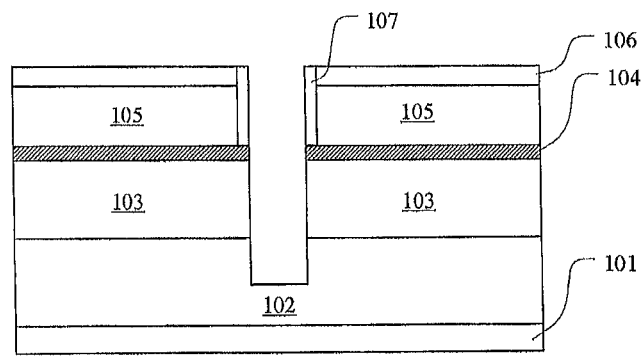

Subsequently, an exposed portion of the first mask layer 104 may be removed via the opening by an etching process as described above, with the third mask layer 106 and the fourth mask layer 107 as a hard mask. Exposed portions of the semiconductor layer 103 and the well region 102 may be further etched, until the opening passes through the semiconductor layer 103 and extends into the well region 102 by a predetermined depth, as shown in FIG. 4. The depth by which the opening extends into the well region 102 may be determined based on design requirements, and can be achieved by controlling the duration of the etching. In an example, the depth is about 10 nm-30 nm, which is sufficient to prevent the dopants in the well region 102 from diffusing into the semiconductor fins during later processes.

Figure 5:
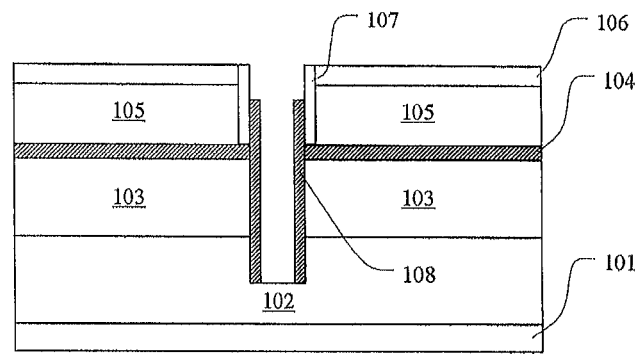

Then, a conformal dielectric layer may be formed on a surface of the semiconductor arrangement by a deposition process as described above. Portions of the dielectric layer laterally extending on the third mask layer 106 and on bottom the opening (i.e., on an exposed surface of the well region 102 in the opening) may be removed by anisotropic etching (e.g., RIE), to leave portions of the dielectric layer on the inner walls of the opening, resulting in back gate dielectric layers 108 as spacer, as shown in FIG. 5. The back gate dielectric layers 108 as spacer may be formed on inner walls of the semiconductor layer 103 and the well region 102 in the opening by thermal oxidation, instead of deposition. In an example, the back gate dielectric layers 108 each may comprise silicon oxide, with a thickness of about 10 nm-30 nm.

Figure 6:
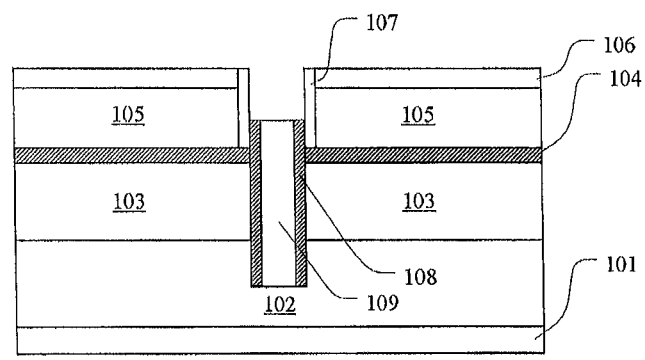

Next, a conductive layer may be formed on a surface of the semiconductor arrangement by a deposition process as described above. The conductive layer fills at least the opening up. The conductive layer may have its portions outside the opening and also some portion thereof inside the opening removed by being etched back, resulting in a back gate conductor 109 in the opening, as shown in FIG. 6. The back gate conductor 109 is separated from the semiconductor layer 103 by the back gate dielectric layers 108. The back gate conductor 109 may comprise one or more selected from TaC, TiN, TaTbN, TaErN, TaYbN, TaSiN, HfSiN, MoSiN, RuTax, NiTax, MoNx, TiSiN, TiCN, TaAlC, TiAlN, TaN, PtSix, Ni$_3$Si, Pt, Ru, Ir, Mo, W, HfRu, RuOx, and doped poly silicon. In an example, the back gate conductor 109 may comprise an n-type or p-type doped poly silicon at a concentration of about 1E18 cm$^{-3}$-1E21 cm$^{-3}$.

The etching back of the back gate conductor 109 makes a top surface of the back gate conductor 109 recessed with respect to a top surface of the back gate dielectric layers 108. Optionally, the back gate dielectric layers 108 may be selectively etched back with respect to the back gate conductor 109 so that the top surface thereof is substantially flush with the top surface of the back gate conductor 109.

Figure 7:
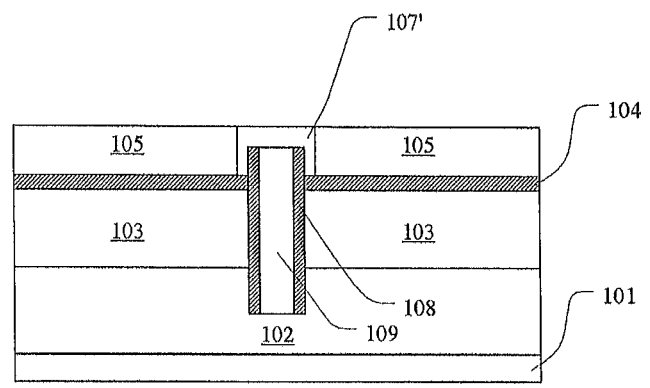

Then, the third mask layer 106 on the second mask layer 105 may be completely removed selectively with respect to the second mask layer 105 by an etching process as described above, without using a mask, to expose a surface of the second mask layer 105. For example, in a case where the second mask layer 105 comprises amorphous silicon and the third mask layer 106 comprises silicon oxide, the silicon oxide may be selectively removed with a HF acid solution. An insulating layer may be formed on a surface of the semiconductor arrangement by a deposition process as described above. The insulating layer may fill at least the opening up and thus cover the top surface of the back gate conductor 109. The insulating layer may have its portions outside the opening removed by being etched back. In an example, the insulating layer may comprise silicon nitride formed by sputtering. This insulating layer together with the fourth mask layer 107 constitutes an insulating cap 107', as shown in FIG. 7. The etching may further remove some portion of the insulating layer inside the opening. The duration of the etching back may be controlled so that the portion of the insulating layer inside the opening covers the top surface of the back gate conductor 109 and thus provides desired electric insulation.

Figure 8:
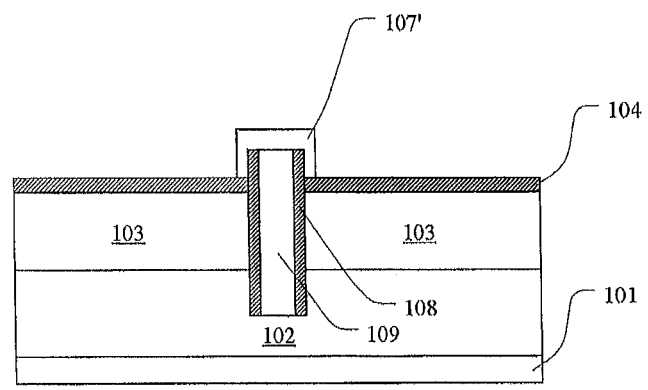

Subsequently, the second mask layer 105 may be completely removed selectively with respect to the insulating cap 107' and the first mask layer 104 by an etching process as described above, without using a mask, to expose a surface of the first mask layer 104, as shown in FIG. 8. For example, in a case where the first mask layer 104 comprises silicon oxide, the second mask layer 105 comprises amorphous silicon, and the insulating cap 107' comprises silicon nitride, the amorphous silicon can be selectively removed by an etchant of TMAH.

Figure 9:
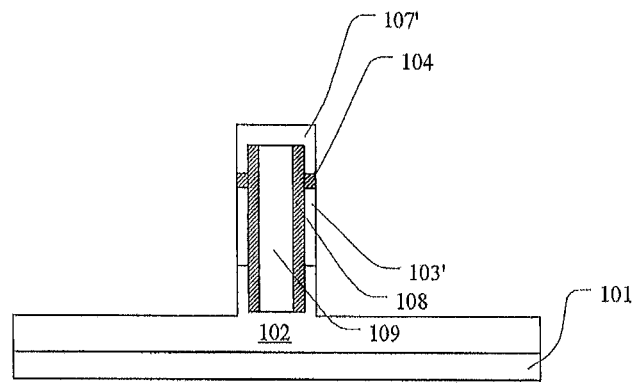
Figure 10:
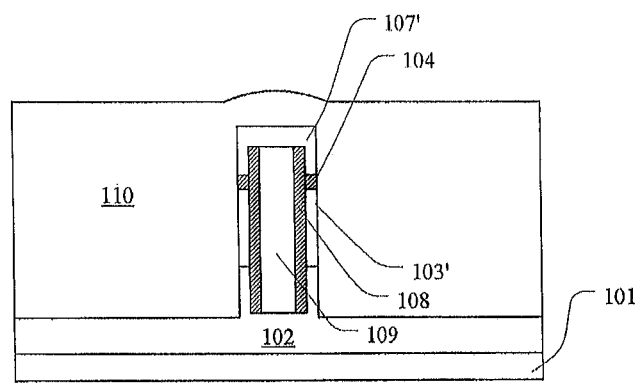

Next, exposed portions of the semiconductor layer 103 may be removed by an etching process as described above with the insulating mask 107' as a hard mask. Exposed portions of the well region 102 may be further etched to a predetermined depth, as shown in FIG. 9. As described in the following, the well region 102 will serve as a part of a conductive path to the back gate. The etching depth may be determined by controlling the duration of the etching, so that the well region 102 can have a certain thickness to reduce associated parasitic resistance.

In this example, the well region 102 is further etched after etching the semiconductor layer 103. However, the present disclosure is not limited thereto. For example, it is also feasible to etch the semiconductor layer 103 or only a portion thereof, without further etching the well region 102, especially if a PTS layer is formed as described in the following.

The etching patterns the semiconductor layer 103 into two semiconductor fins 103' on opposite sides of the back gate conductor 109, and the back gate conductor 109 is separated from the two semiconductor fins 103' by the respective back gate dielectric layers 108, resulting in a sandwich arrangement of Fin-Back Gate-Fin. The semiconductor fins 103' are portions from the original semiconductor substrate 101, and thus also may comprise any one selected from Si, Ge, SiGe, GaAs, GaSb, AlAs, InAs, InP, GaN, SiC, InGaAs, InSb, and InGaSb. In the example shown in FIG. 9, the semiconductor fins 103' each may have a shape of bar, with a length perpendicular to the sheet, a width along a lateral direction in the sheet, and a height along a vertical direction in the sheet. The height of the semiconductor fins 103' is determined substantially by the thickness of the original semiconductor layer 103, the width of the semiconductor fins 103' is determined substantially by the thickness of the original fourth mask layer 107, and the length of the semiconductor fins 103' may be defined by an additional etching operation based on design requirements. In this etching operation and following processes, the already formed back gate conductor 109 provide mechanical support and protection for the semiconductor fins 103', resulting in an improved yield.

Then, a first insulating layer 110 may be formed on a surface of the semiconductor arrangement by a deposition process as described above, as shown in FIG. 10. The first insulating layer 110 may have a thickness sufficient to fill trenches on side of the semiconductor fins 103' formed in etching the semiconductor fins 103' and further cover the insulating cap 107'. If needed, a surface of the first insulating layer 110 may be planarized by sputtering or additional CMP.

After that, the first insulating layer 110 may be etched back by a selective etching process (e.g., RIE). This etching not only removes a portion of the first insulating layer 110 on top of the insulating cap 107', but also reduces portions of the first insulating layer 110 in the trenches on side of the semiconductor fins 103' in thickness. The duration of the etching may be controlled, so that the surface of the first insulating layer 110 is slightly higher than or substantially flush with the top surface of the well region 102 and that side surfaces of the respective semiconductor fins 103' above the well region are exposed.

Figure 11:
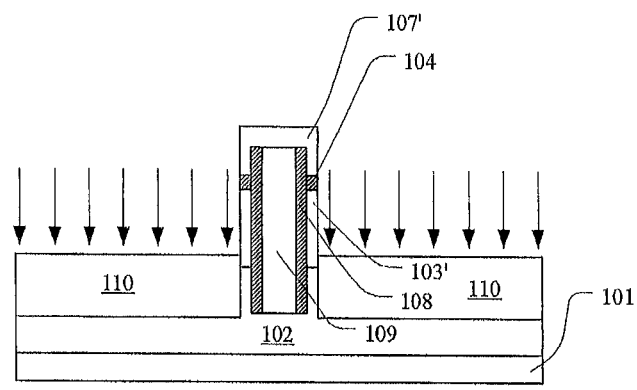
Figure 12:
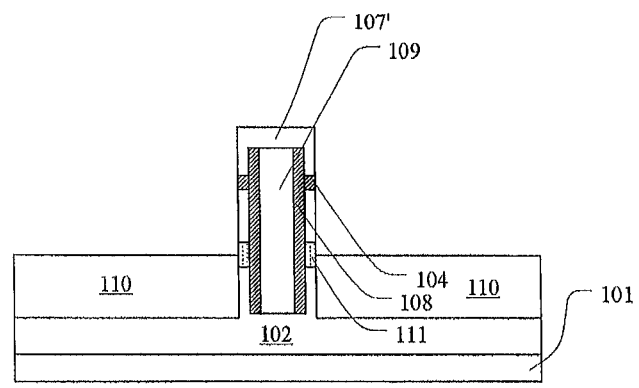
Figure 13:
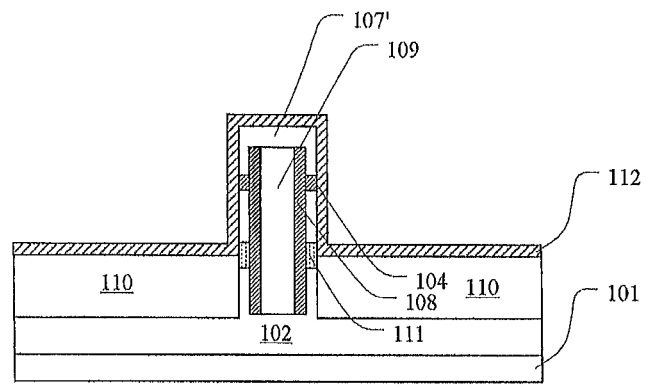

Optionally, dopants maybe implanted into the first insulating layer 110 by ion implantation, as shown in FIG. 11. Due to surface ion scattering, the dopants can easily go into bottom portions of the semiconductor fins 103' from nearby the surface of the first insulating layer 110, so that the bottom portions of the semiconductor fins 103' constitute a PTS layer 111, as shown in FIG. 12. Alternatively, the dopants may be driven in the semiconductor fins from the first insulating layer 110 by additional annealing, to form the PTS layer 111. The PTS layer 111 may also comprise portions of the well region 102 close to the surface of the first insulating layer 110.

Different types of dopants may be used for different types of FETs. For example, p-type dopants, such as B, may be used for an n-type FET, and n-type dopants, such as P or As, may be used for a p-type FET. As a result, the PTS layer 111 separates the semiconductor fins 103' from the well region 102 in the semiconductor substrate 101. Further, the PTS layer 111 may have a doping type contrary to that of source and drain regions, and a doping concentration greater than that of the well region 102 in the semiconductor substrate 101. The well region 102 can break a leakage path between the source and drain regions and function as a PTS to some extent, and the additional highly-doped PTS layer 112 beneath the semiconductor fins 103' can further improve the effect of suppressing the leakage between the source and drain regions.

Subsequently, a floating gate dielectric layer 112 (e.g., silicon oxide, silicon nitride, or high-K dielectrics) may be formed on a surface of the semiconductor arrangement by a deposition process as described above, as shown in FIG. 13. In an example, the floating gate dielectric layer 112 may comprise silicon oxide with a thickness of about 0.8-1.5 nm. The floating gate dielectric layer 112 covers a side surface of each of the semiconductor fins 103'.

As shown in FIG. 14, a floating gate conductor 113 (e.g., doped poly silicon, with a thickness of about 3-10 nm) may be formed on a surface of the semiconductor arrangement by a deposition process as described above. Further, a control gate dielectric layer 117 (e.g., silicon oxide or high-K dielectrics, with a thickness of about 1.0-10 nm) and a control gate conductor 118 (e.g., poly silicon, with a thickness of about 50-150 nm) may be formed on a surface of the semiconductor arrangement by deposition processes as described above. A surface of the control gate conductor 118 may undergo CMP to be substantially planar, if needed. Thus, a stack for a front gate, including the floating gate dielectric layer, the floating gate conductor, the control gate dielectric layer, and the control gate conductor, is achieved.

Then, the stack for the front gate may be patterned into a front gate stack intersecting the semiconductor fins 103' with a photoresist mask. The photoresist mask then can be removed by being dissolved in a solvent or ashed. A nitride layer may be formed on a surface of the semiconductor arrangement by a deposition process as described above. In an example, the nitride layer may comprise silicon nitride with a thickness of about 5-20 nm. Laterally extending portions of the nitride layer may be removed by anisotropic etching (e.g., RIE), to leave vertically extending portions of the nitride layer on side walls of the front gate stack, resulting in gate spacers 114, as shown in FIGS. 15(a), 15(b), 15(c), and 15(d).

Generally, due to a form factor (for example, the front gate stack has a thickness two times greater than the height of the fins, or the fins each are in a tapered shape from bottom up), portions of the nitride layer on the side surfaces of the semiconductor fins 103' may have a thickness less than that of portions of the nitride layer on the side walls of the front gate stack, and thus may be completely removed in the etching. Otherwise, the portions of the nitride layer left on the side surfaces of the semiconductor fins 103' may impact a source/drain formation process to be performed later, and may be further removed with the aid of an additional mask.

The floating gate dielectric layer 112, the floating gate conductor 113, the control gate dielectric layer 117, and the control gate conductor 118 together constitute the front gate stack. In the example shown in FIGS. 15(a), 15(b), 15(c), and 15(d), the front gate stack is in a bar shape, and extends in a direction substantially perpendicular to the length of the semiconductor fins.

After that, source and drain regions connected to channel regions provided in the semiconductor fins 103' may be formed in a conventional process with the front gate stack and the gate spacers 114 as a hard mask. In an example, the source and drain regions may comprise doped regions in opposite end portions of the respective semiconductor fins 103' formed by ion implantation or in-situ doping. Alternatively, the source and drain regions may comprise doped regions in an additional semiconductor layer in contact with the opposite end portions or the side surfaces of the respective semiconductor fins 103 formed by ion implantation or in-situ doping.

Figure 16A:
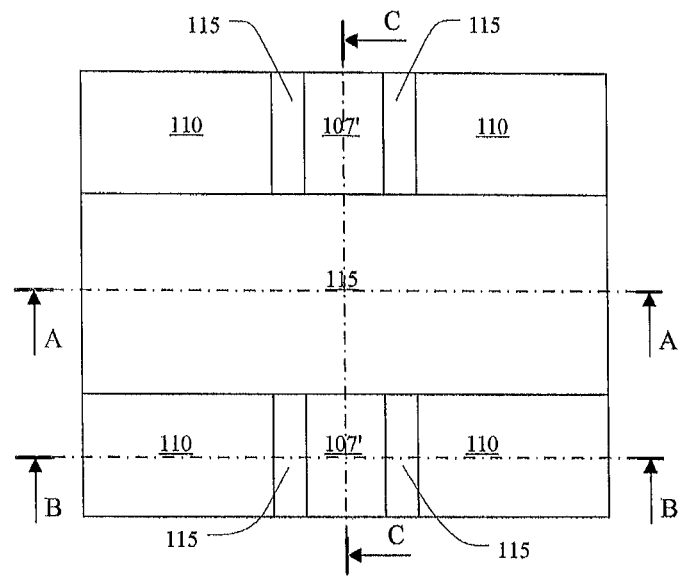
FIGS. 16 and 17 are schematic views showing a part of a flow of manufacturing a flash device according to a further embodiment of the present disclosure.
Figure 16B:
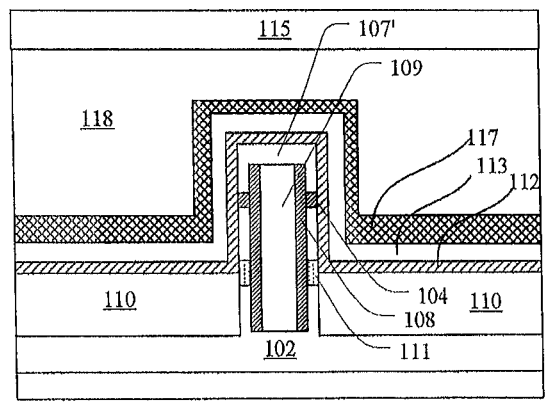
Figure 16C:
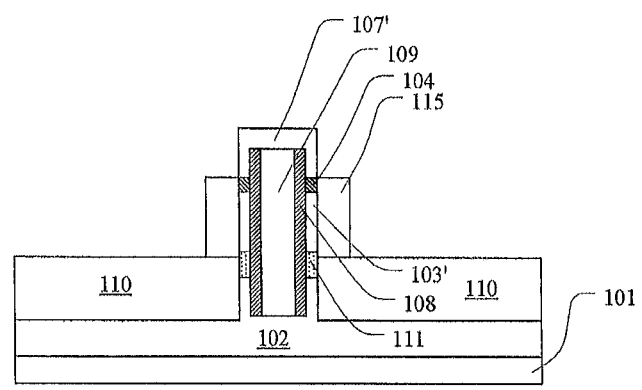
Figure 16D:
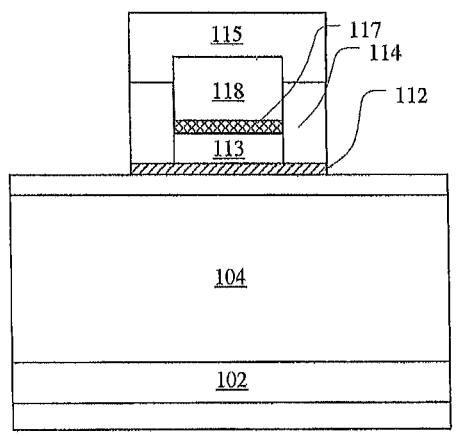
Figure 17A:
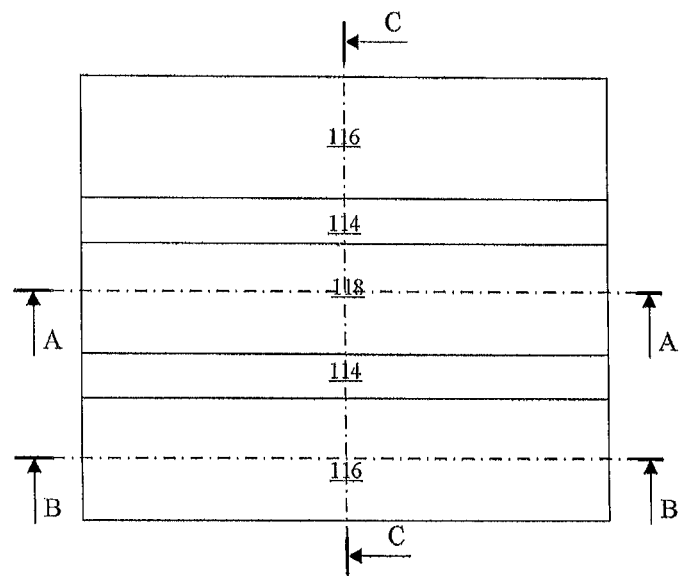
Figure 17B:
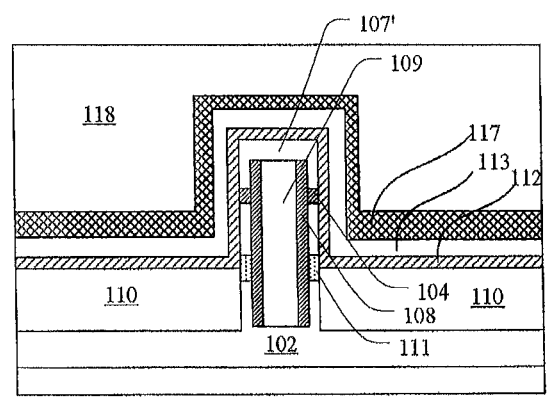
Figure 17C:
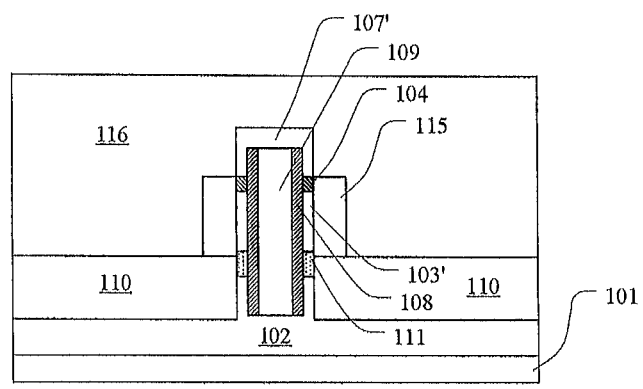
Figure 17D:
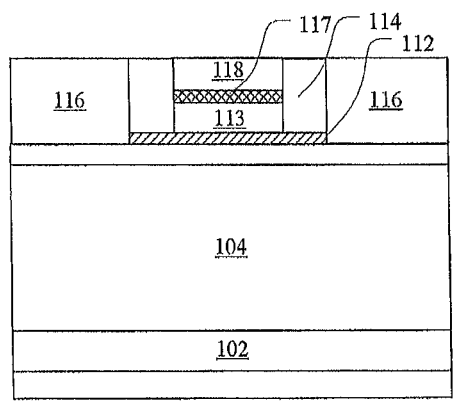

A part of a flow of manufacturing a flash device according to a further embodiment of the present disclosure will be described with reference to FIGS. 16 and 17, wherein FIGS. 16(a) and 17(a) are top views showing the flash device and also positions where sectional views are taken, FIGS. 16(b) and 17(b) are sectional views showing the flash device taken along line A-A in a width direction of a semiconductor fin, FIGS. 16(c) and 17(c) are sectional views showing the flash device taken along line B-B in the width direction of the semiconductor fin, and FIGS. 16(d) and 17(d) are sectional views showing the flash device taken along line C-C in a length direction of the semiconductor fin.

According to this embodiment, operations may be performed on the arrangement shown in FIG. 15 to form a stress applying layer, as shown in FIGS. 16 and 17.

Specifically, a stress applying layer 115 may be epitaxially grown on the exposed side surfaces of the semiconductor fins 103', as shown in FIGS. 16(a), 16(b), 16(c), and 16(d). The stress applying layer 115 may be also grown on the control gate conductor 118. The stress applying layer 115 may have a thickness sufficient to apply desired stress to the semiconductor fins 103'.

The stress applying layer 115 may be formed differently for different types of FETs. It is possible to improve carrier mobility by applying appropriate stress to the channel regions of the flash device by the stress applying layer 115, so as to reduce ON resistance and improve a switching speed of the device. To do this, the stress applying layer 115 may comprise a material different from that of the semiconductor fins 103', to produce the desired stress. For example, the stress applying layer 115 may comprise a Si:C layer, with an atomic percentage of C of about 0.2-2%, formed on the Si substrate to apply tensile stress to the channel regions in a longitudinal direction of the channel regions, for an n-type flash. Or alternatively, the stress applying layer 115 may comprise a SiGe layer, with an atomic percentage of Ge of about 15-75%, formed on the Si substrate to apply compressive stress to the channel regions in the longitudinal direction of the channel regions, for a p-type flash.

Next, a second insulating layer 116 may be formed on a surface of the semiconductor arrangement by a deposition process as described above. In an example, the second insulating layer 116 may comprise silicon oxide, with a thickness sufficient to fill the trenches on side of the semiconductor fins 103' formed in etching the semiconductor fins 103' and further cover the top surface of the control gate conductor 118. The second insulating layer 116 may undergo CMP, with the gate spacers 114 as a stop layer, to have a substantially planar surface, as shown in FIGS. 17(a), 17(b), 17(c), and 17(d). The CMP also removes portions of the stress applying layer 115 on top of the front gate stack, and thus exposes a top surface of the front gate stack, that is, the top surface of the control gate conductor 108.

Further, as described above, source and drain regions connected to the channel regions provided in the semiconductor fins 103' may be formed in a conventional process with the control gate conductor 108 and the gate spacers 114 as a hard mask. In an example, the source and drain regions may comprise doped regions in opposite end portions of the respective semiconductor fins 103' formed by ion implantation or in-situ doping. Alternatively, the source and drain regions may comprise doped regions in an additional semiconductor layer in contact with the opposite end portions or the side surfaces of the respective semiconductor fins 103 formed by ion implantation or in-situ doping.

Figure 18A:
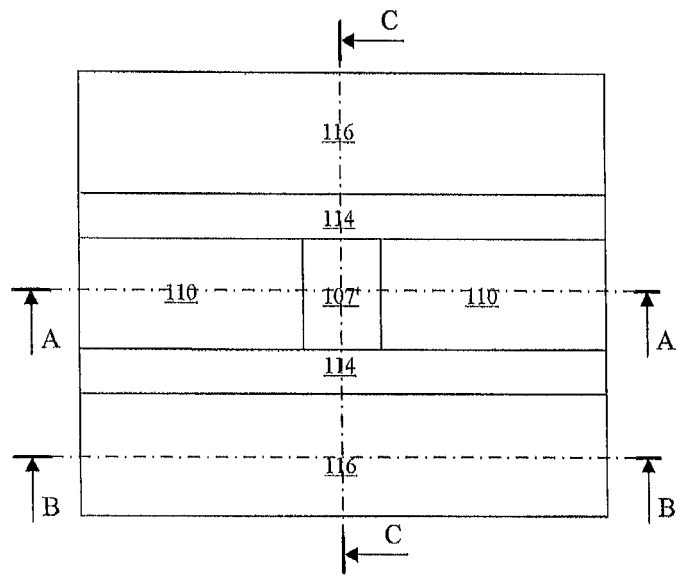
FIGS. 18 and 19 are schematic views showing a part of a flow of manufacturing a flash device according to a further embodiment of the present disclosure.
Figure 18B:
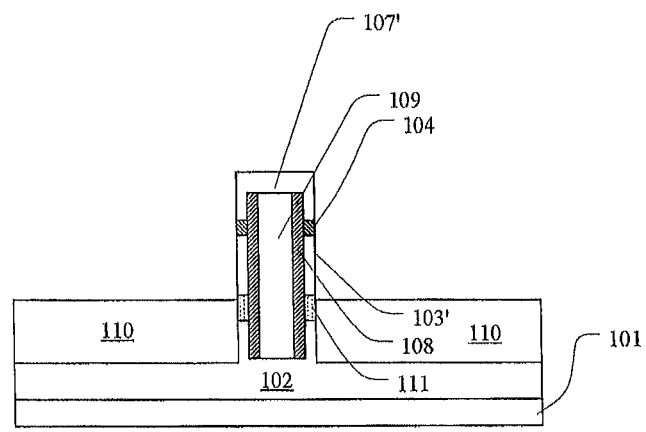
Figure 18C:
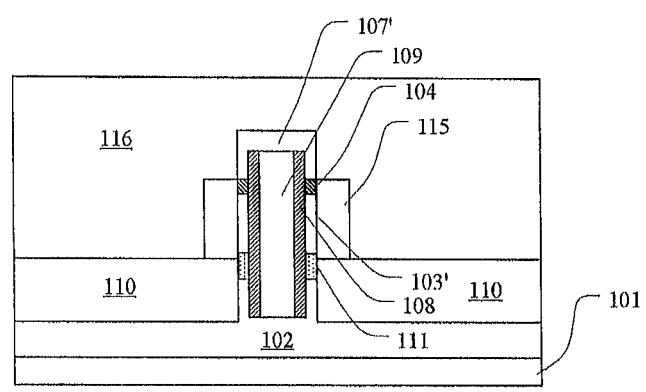
Figure 18D:
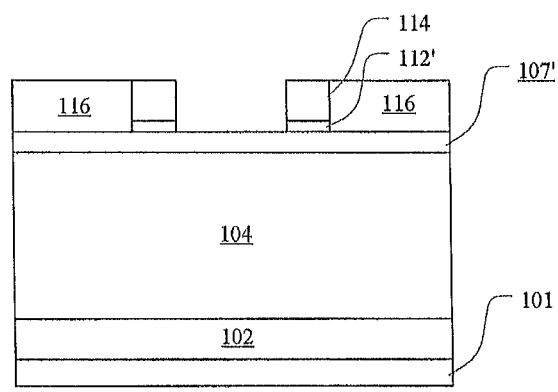
Figure 19A:
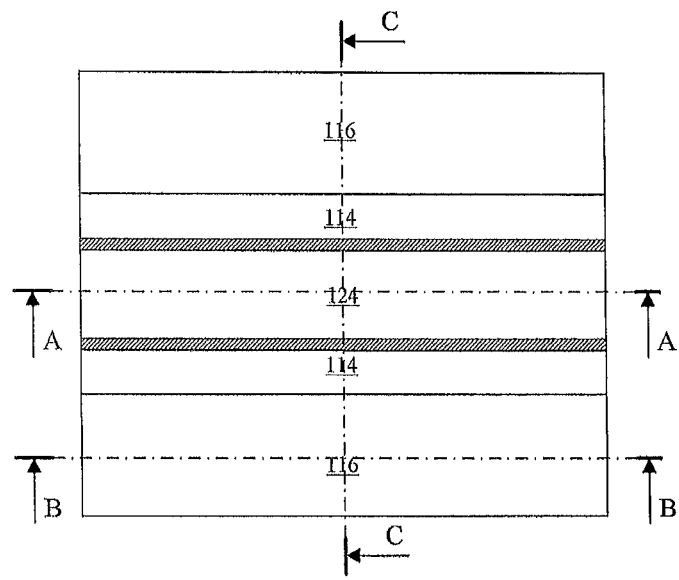
Figure 19B:
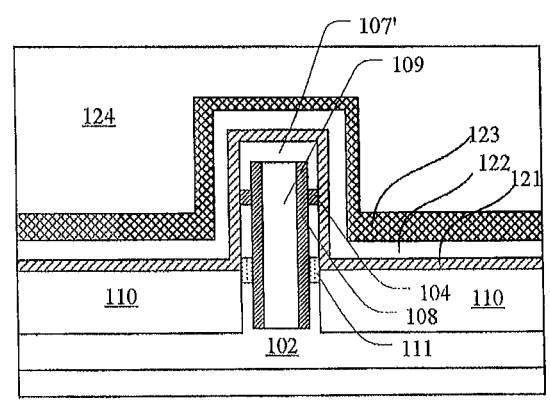
Figure 19C:
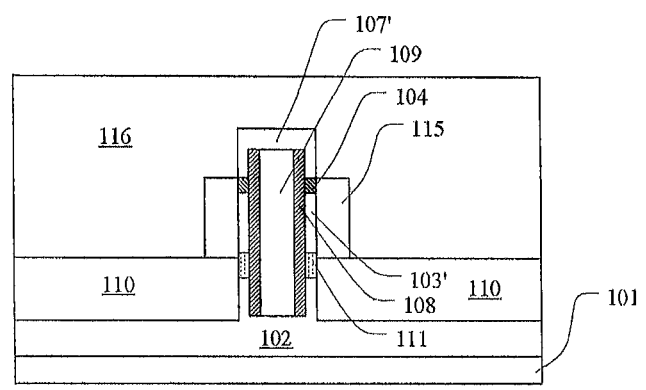
Figure 19D:
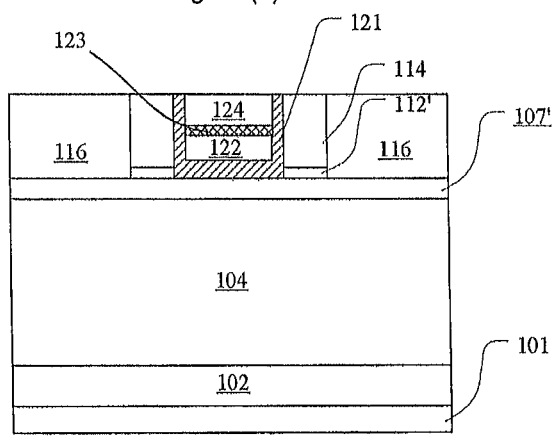

A part of a flow of manufacturing a flash device according to a further embodiment of the present disclosure will be described with reference to FIGS. 18 and 19, wherein FIGS. 18(a) and 19(a) are top views showing the flash device and also positions where sectional views are taken, FIGS. 18(b) and 19(b) are sectional views showing the flash device taken along line A-A in a width direction of a semiconductor fin, FIGS. 18(c) and 19(c) are sectional views showing the flash device taken along line B-B in the width direction of the semiconductor fin, and FIGS. 18(d) and 19(d) are sectional views showing the flash device taken along line C-C in a length direction of the semiconductor fin.

According to this embodiment, the operation described in conjunction with FIG. 15 results in a sacrificial gate conductor 113' and a sacrificial gate dielectric layer 112' and the stress applying layer 115 is formed as described above in conjunction with FIG. 17, and source and drain regions are formed. After that, a replacement gate stack may be formed to replace a sacrificial gate stack including the sacrificial gate conductor 113' and the sacrificial gate dielectric layer 112', as shown in FIGS. 18 and 19. The replacement gate stack may comprise a floating gate dielectric layer 121, a floating gate conductor 122, a control gate dielectric layer 123, and a control gate conductor 124.

Specifically, the sacrificial gate conductor 113' may be removed by an etching process as described above (e.g., RIE), with the second insulating layer 116 and the gate spacers 114 as a hard mask, to form a gate opening, as shown in FIGS. 18(a), 18(b), 18(c), and 18(d). Optionally, portions of the sacrificial gate dielectric layer 112' on bottom of the gate opening may be also removed. Then, the floating gate dielectric layer 121, the floating gate conductor 122, the control gate dielectric layer 123, and the control gate conductor 124 may be formed in the gate opening in a gate last process, as shown in 19(a), 19(b), 19(c), and 19(d). The floating gate dielectric layer 121, the floating gate conductor 122, the control gate dielectric layer 123, and the control gate conductor 124 together constitute the replacement gate stack. In an example, the floating gate dielectric layer 121 and the control gate dielectric layer 123 each may comprise a HfO$_2$ layer with a thickness of about 0.3 nm-1.2 nm, the floating gate conductor 122 may comprise TiN, and the control gate conductor 124 may comprise doped poly silicon.

In the above embodiments, after the source and drain regions are formed, an interlayer insulating layer may be formed on the semiconductor arrangement, plugs may be formed in the interlayer insulating layer, wires or electrodes may be formed on a top surface of the interlayer insulating layer, to complete the flash device.

Figure 20:
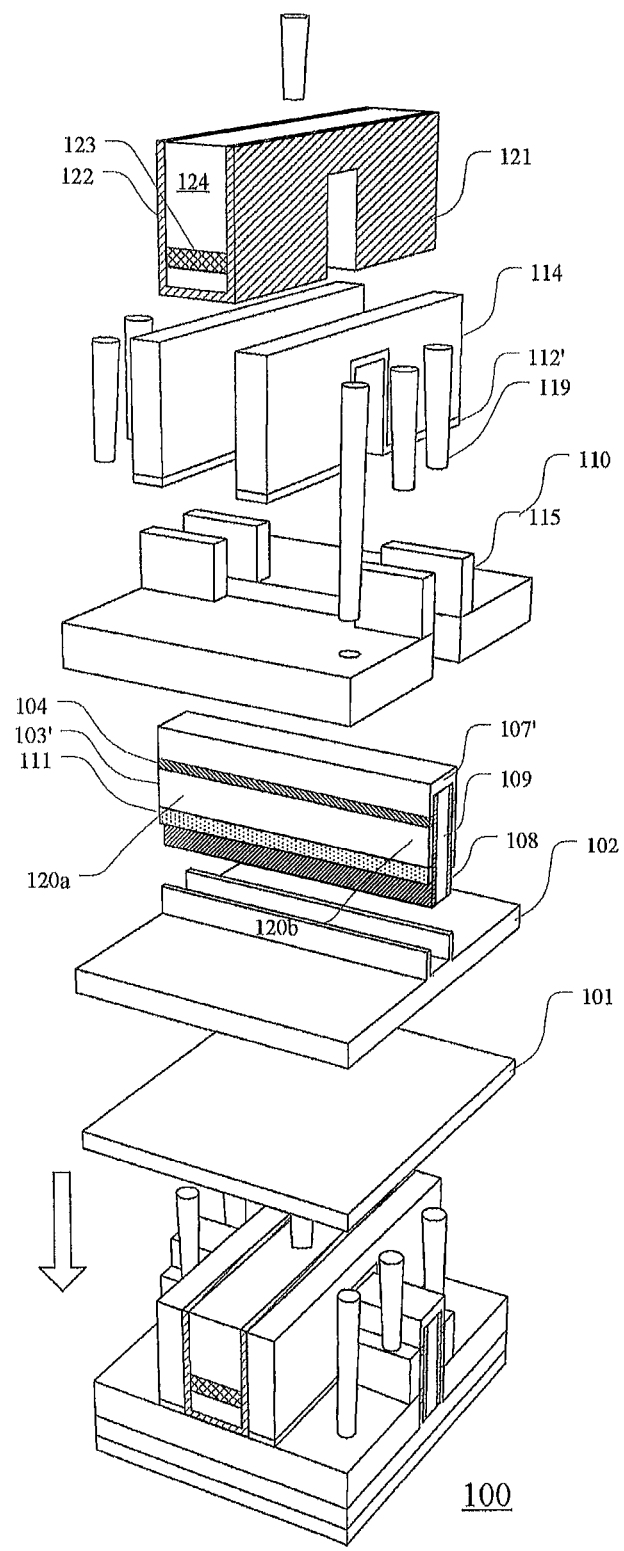
FIG. 20 is an exploded perspective view showing a flash device according to an embodiment of the present disclosure.

FIG. 20 is an exploded perspective view showing a flash device 100 according to an embodiment of the present disclosure, where the second insulating layer 116 is omitted for clarity. The flash device 100 may be achieved by the operations as described above with reference to FIGS. 1-19, and thus comprise various aspects of the present disclosure. However, the present disclosure is not limited to a combination of those aspects. Further, descriptions of the materials which have been described in the above are omitted here for brief.

The flash device 100 comprises a semiconductor substrate 101, a well region 102 formed in the semiconductor substrate 101, and a sandwich arrangement above the well region 102. The sandwich arrangement comprises a back gate conductor 109, two semiconductor fins 103' on opposite sides of the back gate conductor 109, and back gate dielectric layers 108 separating the back gate conductor 109 from the respective semiconductor fins 103'. The well region 102 serves as a part of a conductive path to the back gate conductor 109. A PTS layer 111 is disposed in bottom portions of the semiconductor fins 103'. A front gate stack intersects the semiconductor fins 103', and comprises a floating gate dielectric layer 121, a floating gate conductor 122, a control gate dielectric layer 123, and a control gate conductor 124, wherein the floating gate dielectric layer 121 separates the floating gate conductor 122 from the semiconductor fins 103'.

In the example shown in FIG. 20, the floating gate dielectric layer 121 is a replacement gate dielectric layer formed in the gate last process, the floating gate conductor 122 is a replacement gate conductor formed in the gate last process, the control gate dielectric layer 123 is a replacement gate dielectric layer formed in the gate last process, and the control gate conductor 124 is a control gate conductor formed in the gate last process. Those replacement layers constitute the front gate stack. Gate spacers 114 are disposed on side walls of the front gate stack. During the gate last process, the sacrificial gate dielectric layer 112' have a portion thereof inside the gate opening removed, but portions thereof underneath the gate spacers 114 are left.

Further, an insulating cap 107' is disposed on the back gate conductor 109, and separates the back gate conductor 109 from the front gate stack. A first insulating layer 110 is disposed between the floating gate dielectric layer 121 and the well region 102, and separates the floating gate dielectric layer 121 from the well region 102.

The flash device 100 further comprises a source region 120a and a drain region 120b connected to channel regions provided in the semiconductor fins 103'. In the example shown in FIG. 20, the source region 120a and the drain region 120b may comprise doped regions in opposite end portions of the respective semiconductor fins 103' formed by ion implantation or in-situ doping. An additional stress applying layer 115 is in contact with the side surfaces of the semiconductor fins 103'. Four plugs 119 pass through an interlayer insulating layer and are connected to the source and drain regions of the respective semiconductor fins 103'. An additional plug 119 is connected to the control gate conductor 124, a further plug 119 passes through the interlayer insulating layer and the first insulating layer 110 and is connected to the well region 102 and thus to the back gate conductor 109 via the well region 102.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above. The mere fact that the various embodiments are described separately does not mean that means recited in the respective embodiments cannot be used in combination to advantage.

From the foregoing, it will be appreciated that specific embodiments of the disclosure have been described herein for purposes of illustration, but that various modifications may be made without deviating from the disclosure. In addition, many of the elements of one embodiment may be combined with other embodiments in addition to or in lieu of the elements of the other embodiments. Accordingly, the technology is not limited except as by the appended claims.

I claim:

1. A flash device, comprising:
a semiconductor substrate;
a well region formed in the semiconductor substrate;
a sandwich arrangement on the well region, including a back gate conductor, semiconductor fins on opposite sides of the back gate conductor, and gate dielectric layers separating the back gate conductor from the respective semiconductor fins, wherein the well region serves as a part of a conductive path to the back gate conductor;
a front gate stack intersecting the semiconductor fins, including a floating gate dielectric layer, a floating gate conductor, a control gate dielectric layer, and a control gate conductor stacked sequentially, wherein the floating gate dielectric layer separates the floating gate conductor from the semiconductor fins;
an insulating cap on top of the back gate conductor and the semiconductor fins to separate the back gate conductor from the front gate stack; and
source and drain regions connected to a channel region provided by each of the semiconductor fins.

2. The flash device according to claim 1, further comprising a punch-through stop (PTS) layer formed in a bottom portion of each of the semiconductor fins.

3. The flash device according to claim 2, wherein the device is of n-type, and the PTS layer and the well region are of p-type.

4. The flash device according to claim 2, wherein the device is of p-type, and the PTS layer and the well region are of n-type.

5. The flash device according to claim 1, wherein the source and drain regions comprise opposite end portions of each of the semiconductor fins.

6. The flash device according to claim 1, wherein the source and drain regions comprise doped regions in an additional semiconductor layer in contact with opposite end portions of each of the semiconductor fins.

7. The flash device according to claim 1, wherein the source and drain regions comprise doped regions in an additional semiconductor layer in contact with side surfaces of each of the semiconductor fins.

8. The flash device according to claim 7, wherein the source and drain regions comprise a material different from that of the semiconductor fins.

9. The flash device according to claim 1, further comprising an additional stress applying layer in contact with side surfaces of the semiconductor fins.

10. The flash device according to claim 1, wherein the back gate conductor comprises one or more selected from TaC, TiN, TaTbN, TaErN, TaYbN, TaSiN, HfSiN, MoSiN, RuTax, NiTax, MoNx, TiSiN, TiCN, TaAlC, TiAlN, TaN, PtSix, Ni$_3$Si, Pt, Ru, Ir, Mo, W, HfRu, RuOx, and/or doped poly silicon.

11. A method of manufacturing a flash device, comprising:
forming a well region in a semiconductor substrate, so that a portion of the semiconductor substrate above the well region constitutes a semiconductor layer;
forming a plurality of mask layers on the semiconductor layer;
forming an opening in a top most one of the mask layers;
forming a further mask layer as a spacer on inner walls of the opening;
extending the opening into the well region through the plurality of mask layers and the semiconductor layer with the further mask layer as a hard mask;
forming back gate dielectric layers on inner walls of the opening;
forming a back gate conductor in the opening;
forming an insulating cap including the further mask layer in the opening to cover the back gate dielectric layers and the back gate conductor;
patterning the semiconductor layer into semiconductor fins with the insulating cap as a hard mask;
forming a front gate stack to intersect the semiconductor fins, wherein the front gate stack includes a floating gate dielectric layer, a floating gate conductor, a control gate dielectric layer, and a control gate conductor disposed in sequence from bottom up, and the floating gate dielectric layer separates the floating gate conductor from the semiconductor fins; and
forming source and drain regions connected to a channel region provided by each of the semiconductor fins,
wherein the back gate conductor and the semiconductor fins on opposite sides of the back gate conductor are made from the semiconductor layer, and the back gate dielectric layers separating the back gate conductor from the respective semiconductor fins constitute a sandwich arrangement, wherein the insulating cap separates the back gate conductor from the control gate conductor, and wherein the well region serves as a part of a conductive path to the back gate conductor.

12. The method according to claim 11, wherein between patterning the semiconductor layer and forming the front gate stack, the method further comprises forming a punch-through stop (PTS) layer in a bottom portion of each of the semiconductor fins.

13. The method according to claim 12, wherein forming the PTS layer comprises performing ion implantation to introduce dopants into portions of the semiconductor fins adjacent to the well region.

14. The method according to claim 13, wherein forming the PTS layer further comprises forming an insulating layer to define a position of the PTS layer before the ion implantation.

15. The method according to claim 13, wherein the device is of n-type, p-type dopants are used in forming the well region, and p-type dopants are used in forming the PTS layer.

16. The method according to claim 13, wherein the device is of p-type, n-type dopants are used in forming the well region, and n-type dopants are used in forming the PTS layer.

17. The method according to claim 11, wherein forming the source and drain regions comprises performing ion implantation into opposite end portions of each of the semiconductor fins.

18. The method according to claim 11, wherein forming the source and drain regions comprises forming an additional semiconductor layer in contact with opposite end portions of each of the semiconductor fins, and performing ion implantation into the additional semiconductor layer or doping the additional semiconductor layer in situ.

19. The method according to claim 11, wherein forming the source and drain regions comprises forming an additional semiconductor layer in contact with side surfaces of each of the semiconductor fins, and performing ion implantation into the additional semiconductor layer or doping the additional semiconductor layer in situ.

20. The method according to claim 11, further comprising epitaxially growing a stress applying layer on side surfaces of the semiconductor fins.

21. The method according to claim 11, wherein the back gate conductor comprises one or more selected from TaC, TiN, TaTbN, TaErN, TaYbN, TaSiN, HfSiN, MoSiN, RuTax, NiTax, MoNx, TiSiN, TiCN, TaAlC, TiAlN, TaN, PtSix, $Ni_3Si$, Pt, Ru, Ir, Mo, W, HfRu, RuOx, and/or doped poly silicon.

* * * * *